(12) United States Patent
Zeltzer et al.

(10) Patent No.: US 10,841,709 B2
(45) Date of Patent: Nov. 17, 2020

(54) NANOCOMPOSITE GRAPHENE POLYMER MEMBRANE ASSEMBLY, AND MANUFACTURING METHOD THEREOF

(71) Applicant: WAVES AUDIO LTD., Tel Aviv (IL)

(72) Inventors: Gabriel Zeltzer, Lapid (IL); Gavriel Speyer, Ramat Gan (IL); Meir Shaashua, Tel Aviv (IL); Vlada Artel, Ashdod (IL); Adi Levi, Rosh Haayin (IL); Doron Naveh, Petach Tikvah (IL); Assad U. Khan, Blacksburg, VA (US); Yi Chen Guo, Beijing (CN); Guoliang Liu, Blacksburg, VA (US)

(73) Assignees: WAVES AUDIO LTD., Tel Aviv (IL); VIRGINIA TECH INTELLECTUAL PROPERTIES, INC., Blacksburg, VA (US); BAR-ILAN UNIVERSITY, Ramat Gan (IL)

( * ) Notice: Subject to any disclaimer, the term of this patent is extended or adjusted under 35 U.S.C. 154(b) by 53 days.

(21) Appl. No.: 16/211,926

(22) Filed: Dec. 6, 2018

(65) Prior Publication Data
US 2020/0186938 A1    Jun. 11, 2020

(51) Int. Cl.
*B32B 3/00*    (2006.01)
*H04R 19/04*    (2006.01)
(Continued)

(52) U.S. Cl.
CPC .......... *H04R 19/04* (2013.01); *B81B 3/0021* (2013.01); *B81C 1/00158* (2013.01);
(Continued)

(58) Field of Classification Search
CPC .... H04R 19/005; H04R 19/02; B81B 3/0013; B81B 2201/0257; B81B 2203/0127
See application file for complete search history.

(56) References Cited

U.S. PATENT DOCUMENTS 7,995,777 B2    8/2011  Yu et al.
8,873,341 B2    10/2014 Lebental et al.
(Continued)

FOREIGN PATENT DOCUMENTS

CN    102638753 A    8/2012
CN    107454544 A    12/2017
(Continued)

*Primary Examiner* — Elizabeth E Mulvaney
(74) *Attorney, Agent, or Firm* — McDermott Will & Emery LLP (57) ABSTRACT

A membrane hetero-structure includes a polymer layer and a single-layer or multi-layer graphene sheet disposed on the polymer layer. The membrane hetero-structure is tensioned across a frame having an opening such that both the polymer layer and the graphene sheet extend across the opening. An optional rigid member is provided in a center of the membrane to be spaced apart from edges of the opening. The assembly of the frame and membrane hetero-structure forms an electrostatically driven micro-electro-mechanical system (MEMS) or sound generation and recording apparatus. In one instance, when a voltage signal is applied between an electrode layer parallel to the membrane and contacts on the frame that are electrically connected to the graphene sheet, the membrane hetero-structure is actuated.

20 Claims, 7 Drawing Sheets

(51) Int. Cl.
*B81B 3/00* (2006.01)
*B81C 1/00* (2006.01)
*H04R 19/00* (2006.01)
*H04R 19/02* (2006.01)

(52) U.S. Cl.
CPC .......... *H04R 19/005* (2013.01); *H04R 19/02* (2013.01); *B81B 2201/0257* (2013.01); *B81B 2203/0127* (2013.01); *B81C 2201/0176* (2013.01); *B81C 2203/032* (2013.01); *H04R 2201/003* (2013.01); *H04R 2307/023* (2013.01)

(56) References Cited

U.S. PATENT DOCUMENTS

| | | |
|---|---|---|
| 9,246,468 B2 | 1/2016 | Son et al. |
| 9,811,774 B2 | 11/2017 | Lettow et al. |
| 9,900,698 B2 | 2/2018 | Luzzato et al. |
| 10,490,315 B2 * | 11/2019 | Zurutuza Elorza ...... H01B 5/14 |
| 10,582,305 B2 * | 3/2020 | Zhou ...................... H04R 19/02 |
| 2010/0143726 A1 | 6/2010 | Golzhauser et al. |
| 2014/0270271 A1 | 9/2014 | Dehe et al. |
| 2016/0173967 A1 | 6/2016 | Nawrocki |
| 2016/0295338 A1 | 10/2016 | Lettow et al. |
| 2017/0006382 A1 | 1/2017 | Luzzato et al. |
| 2017/0188158 A1 | 6/2017 | Riechers et al. |

FOREIGN PATENT DOCUMENTS

| | | | |
|---|---|---|---|
| KR | 2017079535 | * | 7/2017 |
| WO | 2016148860 A1 | | 9/2016 |
| WO | 2016199009 A1 | | 12/2016 |
| WO | 2017077331 A1 | | 5/2017 |
| WO | 2018023842 A1 | | 2/2018 |

\* cited by examiner

NANOCOMPOSITE GRAPHENE POLYMER MEMBRANE ASSEMBLY, AND MANUFACTURING METHOD THEREOF

TECHNICAL FIELD

The present subject matter relates to nanocomposite graphene polymer membranes, assemblies including the membranes, and methods for manufacturing the membranes and assemblies.

BACKGROUND

The field of efficient and accurate sound generation and recording has relied on the same speaker/microphone structures and materials for numerous years. In a typical speaker, a diaphragm is suspended by an elastic suspension ring from a speaker frame or basket and a coil/magnet structure is used to actuate the diaphragm to output sound. Similarly, in a typical microphone, the coil/magnet structure is used to sense movement of the suspended diaphragm caused by received sound. The efficiency, sensitivity, and precision of a speaker or microphone is limited by the characteristics of the materials forming the structure, including characteristics such as weight and elasticity.

In order to improve the function, sensitivity and efficiency of sound generation and recording apparatuses, a need therefore exists for speakers or microphones formed using high performance materials and structures.

SUMMARY

The teachings herein alleviate improve the function, sensitivity and efficiency of sound generation and recording apparatuses and other micro-electro-mechanical systems (MEMS) through the use of nanocomposite graphene polymer membranes and assemblies including such membranes, and the provision of methods for manufacturing such membranes and assemblies.

In accordance with the principles of the disclosure, an assembly includes a frame having an opening, and a membrane hetero-structure contacting the frame and extending across the opening and including a polymer layer extending across the opening and a graphene layer disposed on the polymer layer and extending across the opening.

The graphene layer may include a graphene sheet extending fully across the opening of the frame. The graphene sheet may be a single-layer graphene sheet, or the graphene sheet may be a multi-layer graphene sheet including a plurality of single-layer graphene sheets each extending fully across the opening of the frame.

The assembly may further include a rigid member disposed on the membrane hetero-structure at a location in the opening of the frame, where the rigid member is spaced apart from all edges of the opening in the frame. The rigid member may include a rigid material including at least one of ceramic, glass, metal, metal oxide, silicon, silica, quartz, and sapphire. The rigid member may include a polymer layer having a stiffness higher than stiffnesses of each of the membrane hetero-structure, the polymer layer, and the graphene layer. The opening may have a diameter of 12-60 mm, and the rigid member may have a diameter smaller than the opening and within the range of 10-20 mm.

The membrane hetero-structure may extend with a tension across the opening of the frame. The membrane hetero-structure may extend across the opening of the frame with the tension of 0.1-1000 N/m.

The member hetero-structure may further include a second polymer layer extending across the opening and disposed such that the graphene layer is between the polymer layer and the second polymer layer. The member hetero-structure may further include a plasmonic nanoparticle layer disposed between the graphene layer and the second polymer layer. The member hetero-structure may further include a single or multi-layer graphene disposed on the second polymer layer. The member hetero-structure may further include one or more repetitions of the polymer/graphene/polymer/graphene structure.

The assembly may further include at least one electric contact terminal mounted to the frame and electrically connected to the graphene layer.

The opening may have a diameter of 10 to 100 mm, and the membrane hetero-structure may extend across a diameter of the opening.

The opening may have a diameter of 12 to 60 mm, and the membrane hetero-structure may extend across a diameter of the opening.

The membrane hetero-structure may have a thickness less than or equal to 600 nm.

In accordance with a further aspect of the disclosure, a method of forming a micro electro-mechanical system (MEMS) includes applying an adhesive to a frame having an opening, and tensioning a membrane hetero-structure on the applied adhesive across the opening of the frame, where the membrane hetero-structure includes a polymer layer extending across the opening and a graphene layer disposed on the polymer layer and extending across the opening.

The method may further include, following the tensioning, annealing the assembly of the membrane hetero-structure tensioned across the opening of the frame.

The method may further include forming the graphene layer on a metal foil using a chemical vapor deposition (CVD) process, and forming the polymer layer on the graphene layer using a spin coating, spray coating, or solvent casting process to form the membrane hetero-structure having the metal foil on a first surface thereof, where the membrane hetero-structure is tensioned on the applied adhesive across the opening of the frame following the forming thereof.

The tensioning the membrane hetero-structure on the applied adhesive across the opening of the frame may further include mounting a support member to a second surface of the membrane hetero-structure including the polymer layer and the graphene layer, where the second surface is disposed opposite to the first surface having the metal foil, removing the metal foil from the first surface of the membrane hetero-structure using an etching process, applying the frame having the adhesive applied thereto to the first surface of the membrane hetero-structure following the removal of the metal foil, and removing the support member from the second surface of the membrane hetero-structure following the application of the frame.

The method may further include forming a rigid member on the membrane hetero-structure at a location in the opening of the frame, wherein the rigid member is spaced apart from all edges of the opening in the frame.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various assemblies and methods disclosed herein relate to nanocomposite graphene polymer membranes, assemblies including the membranes, and methods for manufacturing the membranes and assemblies. The membranes and assemblies can be used in sound generation and recording apparatuses and other micro-electro-mechanical systems (MEMS).

A nanocomposite graphene polymer membrane includes a graphene layer and a polymer layer. The graphene layer is a single-layer graphene sheet or a multi-layer graphene sheet, and is in direct contact with the polymer layer. The membrane is mounted on a rigid frame having an opening, and each of the graphene layer and the polymer layer extends integrally across the opening of the rigid frame. The graphene layer is conductive, and the membrane is actuated by applying a voltage or current signal to the graphene layer. For example, electrical contacts on the rigid frame can be in electrical contact (e.g., in direct contact, or in electrical contact through a conductive adhesive layer) with the graphene layer and can thereby apply charge to the graphene layer to actuate the membrane.

The use of the composite multi-layer membrane including the graphene layer and the polymer layer provides for a flexible, elastic, thin, and highly resilient membrane that can be used for sound generation and recording apparatuses and other micro-electro-mechanical systems (MEMS). A rigid member can be positioned in a center of the membrane to be suspended in the opening of the frame by the elastic membrane.

The nanocomposite multi-layer membrane has high resilience relative to its thickness, and thereby provides a very light membrane. For example, a multi-layer graphene and polymer membrane can be formed in which the suspended diameter over the total graphene and polymer thickness ratio is larger than 1,000,000, thus bringing the total mass of the moving membrane to several milligrams for a diameter in the 18-35 mm range (or, more broadly, a 10-100 mm opening, or more preferably a 12-60 mm opening). This reduced mass makes the membrane comparable in weight to the mass of air displaced when the total sound pressure level (SPL) approaches audible values at several feet from the device. The mechanical actuation of the membrane can be achieved via an electrostatic force and can take advantage of the enhanced electrical conductivity and surface charge capacitance of the single-layer or multi-layer graphene layer within the membrane.

The very small mass of the graphene layer provides for highly efficient sound generation while maintaining a membrane thickness that can be as low as 40 nm while being suspended across an opening with a 9 mm or greater diameter, thus providing a total sound pressure level that is elevated for the membrane weight. For example, the composite membrane hetero-structure and assembly can generate sound pressure levels (SPLs) in the 65-75 dB audible range by using a larger diameter membrane made from the stiff and flexible composite material layers loaded at a specific desirable tension. In particular, the combination of the electronic and mechanical properties of the graphene layer sub constituents embedded inside the nanocomposite hetero-structure enable the membrane to have a reduced thinness while maintaining strength and elasticity. The composite material approach solves a problem which has not been addressed by stand-alone suspended graphene membranes due to the large number of imperfections caused by the graphene growth process.

Figure 1A:
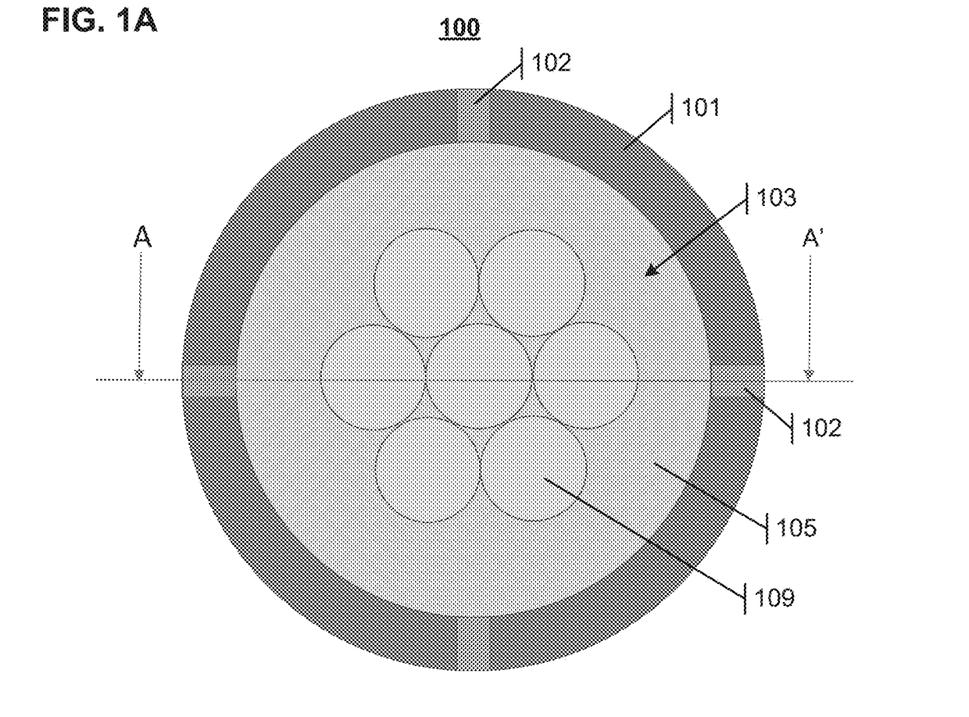
FIGS. 1A and 1B are diagrams illustrating top and cross-sectional views, respectively, of an assembly including a nanocomposite graphene polymer membrane in accordance with the present disclosure.
Figure 1B:
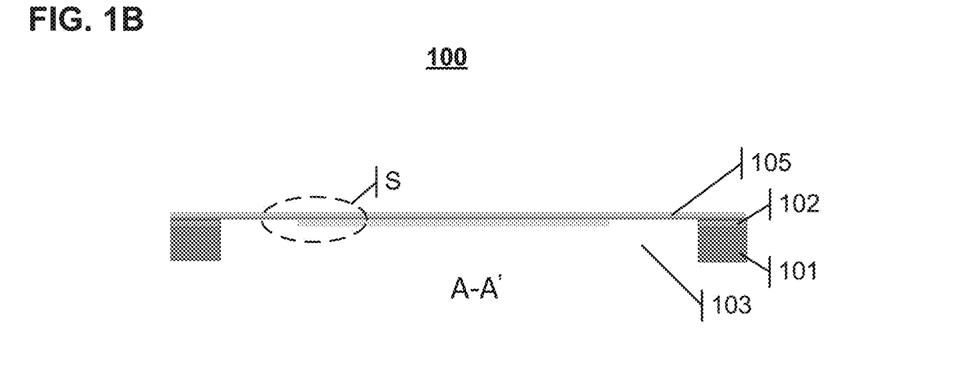
Figure 1C:
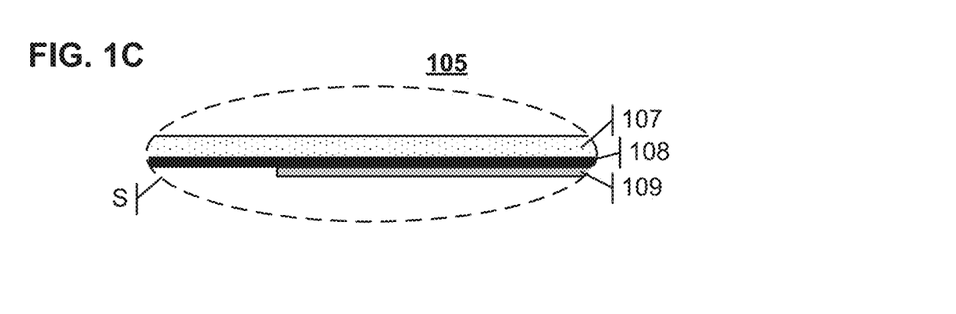
FIG. 1C is a detailed view of area 'S' of the nanocomposite graphene polymer membrane shown in FIG. 1B.

Reference now is made in detail to the examples illustrated in the accompanying drawings and discussed below. FIGS. 1A and 1B show a top view and a cross-sectional view, respectively, of an assembly 100 in accordance with the principles of the disclosure. FIG. 1C shows a detailed view of area 'S' of the cross-sectional view of FIG. 1B.

The assembly includes a frame 101 and a membrane hetero-structure 105. The frame 101 has an opening 103, such that the frame 101 extends integrally and uninterrupted around the opening 103. The frame 101 is rigid and includes a substantially planar upper edge or surface across which the membrane hetero-structure 105 is mounted and tensioned. The frame 101 can be formed of ceramic or other materials, and in some embodiments is formed of an electrically insulating material. The opening 103 in the frame 101 may have a diameter of 10-100 nm, and may more specifically have a diameter of 12-60 mm. The frame 101 has a thickness and width sufficient to maintain rigidity.

The membrane hetero-structure 105 contacts and is mounted to or suspended from the frame 101, and extends integrally across the opening 103. The membrane hetero-structure 105 is flexible and can be tensioned across the frame 101. For example, the membrane hetero-structure 105 can be mounted across the frame 101 to have a tension of 0.1-1000 N/m, or more specifically a tension of 1-100 N/m.

As shown in the detailed view of FIG. 1C, the membrane hetero-structure 105 includes a polymer layer 107 extending integrally (e.g., uninterrupted) across the opening 103 and a graphene layer 108 disposed on (or below) the polymer layer 107 and extending integrally (e.g., uninterrupted) across the opening 103. The graphene layer 108 can be adhered on one surface thereof to the polymer layer 107 and in direct contact therewith, as shown in FIGS. 1B and 1C. The graphene layer 108 can further be adhered on another surface thereof to the frame 101.

The membrane hetero-structure 105 formed of the polymer layer 107 and the graphene layer 108 is flexible. The membrane hetero-structure 105 can have thickness of less than 600 nm, such as a thickness of 50-500 nm. The membrane hetero-structure 105 can be tensioned across the opening 103 having the diameter within a range of 10-100 mm (and in some embodiments, a diameter of 12-60 mm).

Optionally, the membrane hetero-structure 105 further includes a rigid or stiff member 109, such as a stiff polymer or resist layer that has high rigidity. The rigid member 109 can be formed of ceramic, glass, metal, metal oxide, silicon, silica, quartz, cured epoxy materials, printed nanostructured inks, and/or sapphire. The rigid member 109 is mounted or attached to one of the polymer layer 107 and the graphene layer 108, and has a stiffness higher than either of the polymer layer 107 and the graphene layer 108. As shown in FIGS. 1A and 1B, the optional rigid member 109 does not extend fully across the opening 103 but is instead mounted, attached, or suspended to/from a portion of the polymer layer 107 or the graphene layer 108 extending across the opening 103. In particular, a surface area of the rigid member 109 is less than a surface area of the opening 103, and the rigid member 109 is disposed in the opening 103 while being spaced apart from all edges of the opening 103. For example, in an embodiment in which the opening has a diameter of 12-60 mm, the rigid member 109 may have a diameter smaller than the opening and within the range of 10-20 mm. As shown in FIG. 1A, the rigid member 109 can be formed of multiple different elements. For example, rigid member 109 can be formed of seven (7) individual round members that are tangent to each other, and the overall assembly of elements forming the rigid member 109 is spaced apart from edges of the opening 103. The rigid member 109 may have an overall thickness less than 10 µm.

In some embodiments, the frame 101 includes contacts 102, such as the four (4) contacts illustratively depicted in FIG. 1A. The contacts 102 are disposed on, extend to, or otherwise contact the substantially planar upper edge or surface of the frame 101 across which the membrane hetero-structure 105 can be mounted and tensioned. In this way, the contacts 102 come into direct contact with any membrane hetero-structure 105 mounted on the frame 101 or into direct contact with a conductive adhesive used to mount the membrane hetero-structure 105 on the frame 101. In such embodiments, the membrane hetero-structure 105 is positioned such that the graphene layer 108 faces the frame 101 and the contacts 102, and such that the polymer layer 107 is positioned on a side of the membrane hetero-structure 105 facing away from the frame 101. As such, the graphene layer 108, which is conductive, comes into electrical contact with the contacts 102. A voltage potential can thus be applied to the graphene layer 108 through the contacts 102. The contacts 102 are formed of a conductive material such as a conductive metal, and may be formed of gold or palladium. In operation, the contacts 102 can be connected to a voltage or current source, or to a ground potential.

Figure 2:
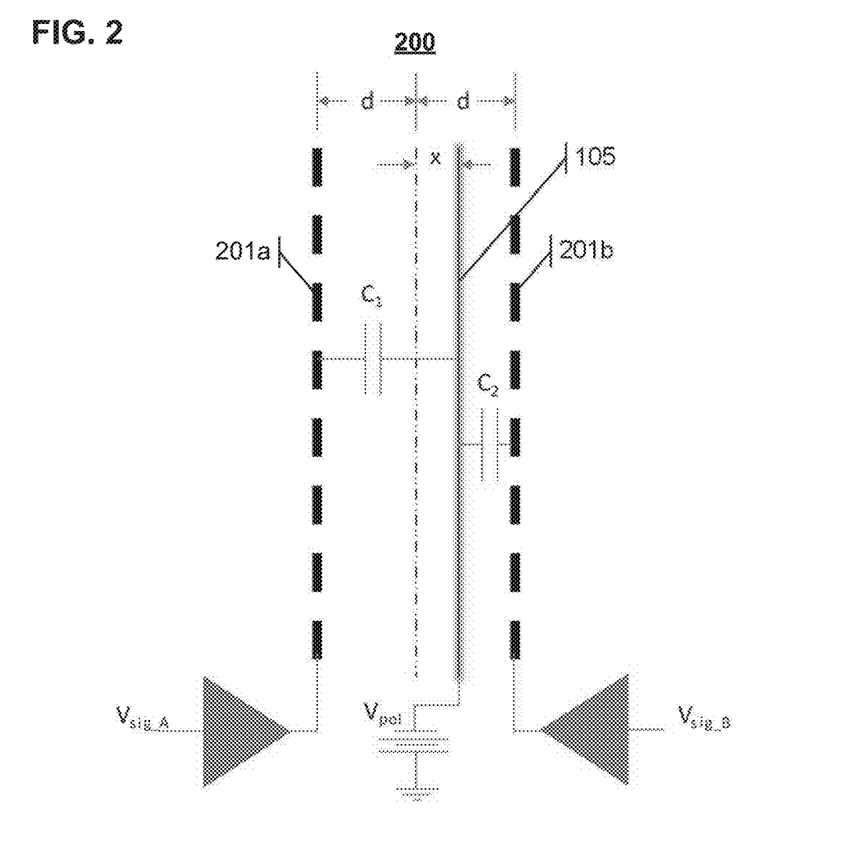
FIG. 2 is a schematic diagram of an actuator or electrostatic speaker that includes a nanocomposite graphene polymer membrane and assembly such as that depicted in FIGS. 1A and 1B.

In some embodiments, the membrane hetero-structure 105 can be used as part of an actuator or an electrostatic speaker. For example, the membrane hetero-structure 105 can function as a membrane of the electrostatic speaker, as illustratively shown in FIG. 2. FIG. 2 shows a schematic diagram of an actuator or electrostatic speaker 200 in which a membrane hetero-structure 105 is positioned adjacent to one or two layers of electrode(s) 201a, 201b. In particular, the membrane hetero-structure 105 may be substantially parallel to the electrode layers 201a, 201b, and may be spaced apart from the electrode layers 201a, 201b and between the electrode layers 201a, 201b in embodiments in which two electrode layers are provided.

Note that FIG. 2 shows a cross-sectional view of the membrane 105 at a location in the middle of an opening (e.g., 103) of a frame such as the frame 101 of FIGS. 1A and 1B. The electrode layers 201a, 201b are parallel to the membrane 105 and are mounted fixedly relative to the frame 101. While that while the membrane 105 is illustratively shown here as being substantially flat, the membrane 105 may more generally have a gradual curvature (e.g., so as to approximate a plane cut from a spherical surface).

In the example, the membrane hetero-structure 105 may have a resting position disposed at a distance d from each of the electrode layers 201a, 201b. In order to actuate the membrane hetero-structure 105, a voltage potential can be applied between the membrane hetero-structure 105 and the electrode layer(s) 201a, 201b. For instance, the membrane hetero-structure 105 may be connected to a fixed voltage potential $V_{pol}$ or a ground potential, and voltage signals $V_{sig\_A}$ and $V_{sig\_B}$ may respectively be applied to the electrode layer(s) 201a and 201b. In response to applied voltage or current signals, attraction between charges in the membrane hetero-structure 105 and electrode layers 201a, 201b cause a force to be applied to the membrane hetero-structure 105 and may thereby cause the membrane hetero-structure 105 to be deflected by a distance (e.g., a distance x, as shown in FIG. 2) from its resting position.

In particular, a combination of the conductive membrane hetero-structure 105 and the conductive first electrode layer 201a may form a first capacitor $C_1$, and attraction forces between charges on the membrane hetero-structure 105 and first electrode layer 201a functioning as capacitor plates may cause a deflection of the membrane hetero-structure 105 relative to the first electrode layer 201a. Similarly, a combination of the conductive membrane hetero-structure 105 and the conductive second electrode layer 201b may form a second capacitor $C_2$, and attraction forces between charges on the membrane hetero-structure 105 and second electrode layer 201b functioning as capacitor plates may cause a deflection of the membrane hetero-structure 105 relative to the second electrode layer 201b.

In operation, the membrane hetero-structure 105 can thus function as a membrane of the electrostatic speaker 200. Specifically, the membrane hetero-structure 105 can be caused to move in response to applied voltage or current signals between the membrane hetero-structure 105 and the electrode layer(s) 201a, 201b to thereby cause output of audio waves. The movement of the membrane hetero-structure 105 can further cause a substantially rectilinear displacement of a rigid member 109 (not shown in FIG. 2) mounted to the membrane hetero-structure 105.

Figure 3:
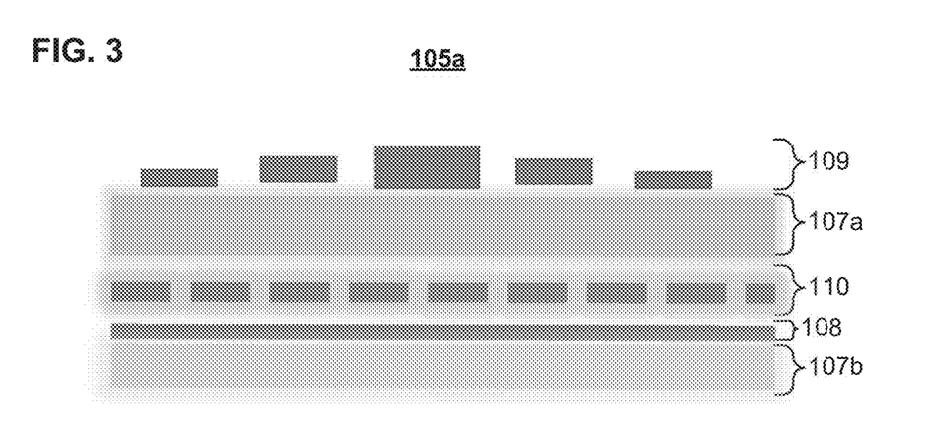
FIG. 3 is a diagram illustrating a cross-sectional view of an alternative nanocomposite graphene polymer membrane in accordance with the present disclosure.

While one illustrative embodiment of a membrane hetero-structure 105 is shown in FIGS. 1A-1C, the membrane hetero-structure can have alternative structures. For example, FIG. 3 shows an alternative membrane hetero-structure 105a that includes layers additional to those shown in membrane hetero-structure 105 of FIGS. 1A-1C. In particular, the membrane hetero-structure 105a includes one or more of a second polymer layer 107b (in additional to a first polymer layer 107a), that is for example disposed on an opposite side of the graphene layer 108 relative to the first polymer layer 107a. The first and second polymer layers 107a and 107b may be formed of a same polymer, and may have same or similar characteristics (e.g., thickness, elasticity, etc.) as each other. Alternatively, the first and second polymer layers 107a and 107b may be formed of different polymers, and/or may have one or more dissimilar characteristics (e.g., thickness, elasticity, etc.).

In addition to or instead of the second polymer layer 107b, the alternative membrane hetero-structure 105a can include an optional plasmonic nanoparticle layer 110. The plasmonic nanoparticle layer 110 can be disposed between the first polymer layer 107a and the graphene layer 108, as shown in FIG. 3 or can alternatively be disposed on an opposite side of the graphene layer 108 relative to the first polymer layer 107a.

Alternatively or additionally, the membrane hetero-structure 105 can include multiple alternating layers of graphene and polymer such as layers 108 and 107. For example, the membrane 105 can include one or more repetitions of the polymer/graphene polymer/graphene structure to form a multi-layer membrane 105 having four or more layers. In one embodiment, the rigid member 109 may be provided between two repetitions of the polymer/graphene layer structures.

Figure 6:
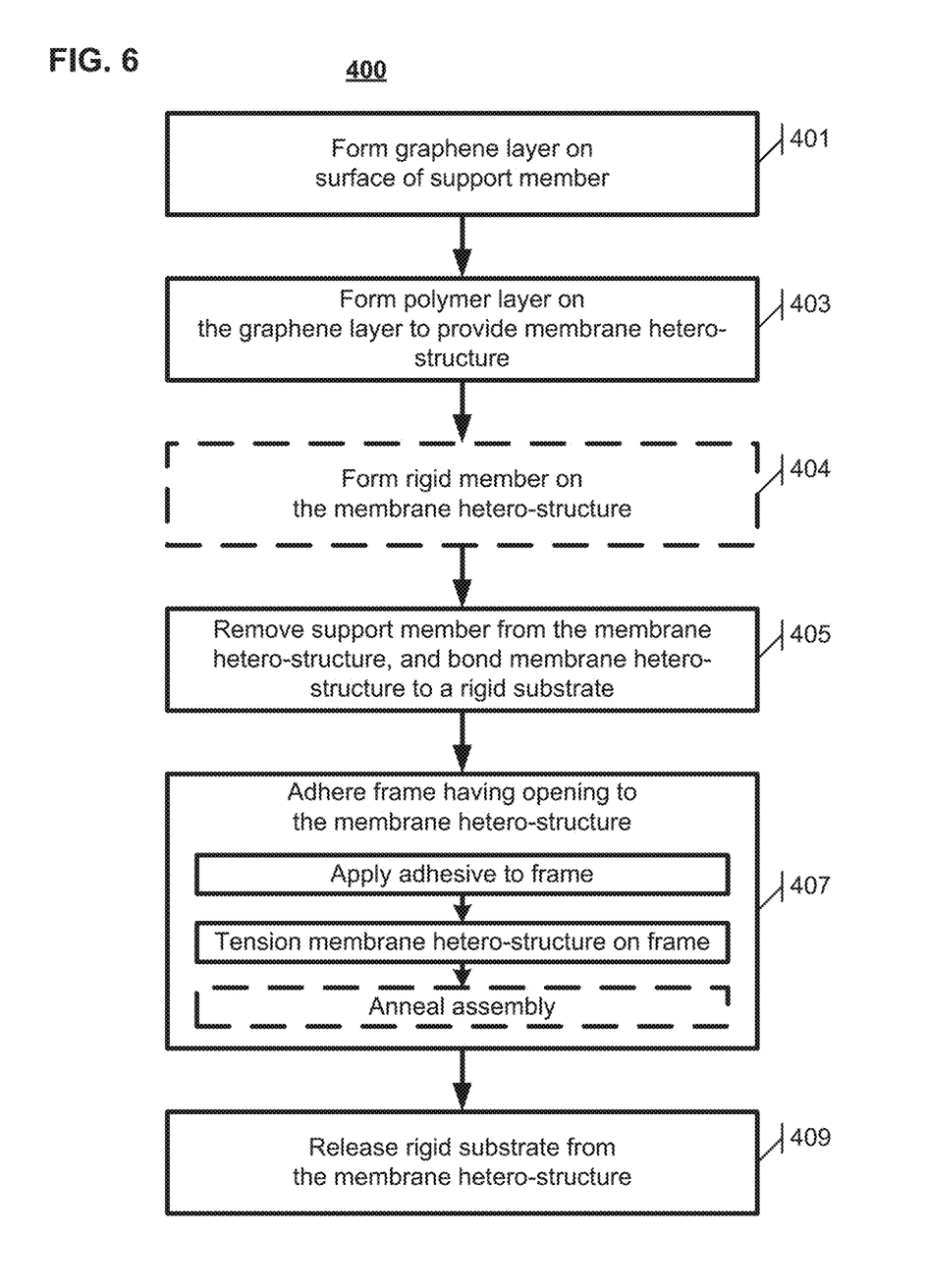
FIG. 6 is a high-level functional block diagram of the method depicted in FIGS. 4A-4F for manufacturing a nanocomposite graphene polymer membrane and assembly such as those shown in FIGS. 1A and 1B.

FIGS. 4A-4F illustrate sequential steps of a method 400 for manufacturing the membrane hetero-structure 105 and assembly 100 of FIG. 1A, and FIG. 6 shows a simplified flow diagram illustrating the sequence of steps of the method 400. The method 400 begins in step 401 shown in FIG. 4A with the forming of the graphene layer 108 on a surface of a support member 411. The support member 411 can be a metal support member formed of a copper (Cu) or nickel (Ni) metal foil. The graphene layer 108 thus formed may be a single-layer graphene (SLG) or a multi-layer graphene (MLG) layer. The graphene layer 108 can be grown on the support member 411 by low pressure and high temperature chemical vapor deposition (CVD). The graphene layer 108 is grown to extend integrally (e.g., uninterrupted) across the surface of the support member 411 as an uninterrupted sheet of graphene, and the graphene layer 108 can be formed exclusively or only of graphene.

Figure 4A:
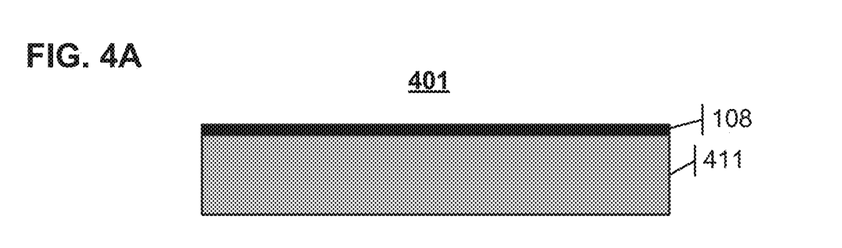
FIGS. 4A-4F are diagrams illustrating sequential steps of a method for manufacturing a nanocomposite graphene polymer membrane and assembly such as those shown in FIGS. 1A and 1B.

The support member 411 or metal foil may be flat, as shown in FIG. 4A, so as to cause the graphene layer 108 to grow flat. Alternatively, the support member 411 may have specific preformed corrugations so as to cause the graphene layer 108 to grow with preformed corrugations therein that follow the predefined corrugations in the support member 411.

Prior to the forming of the graphene layer 108, the support member 411 may be cleaned using solvent cleaning methods. Such an example consists of acetone, isopropyl alcohol (IPA), and/or deionized (DI) water with high power agitation. The support member 411 may be dried using dinitrogen ($N_2$). In turn, the graphene layer 108 can be grown on the cleaned and dried support member 411. In one example, the graphene layer 108 is formed by sequentially: (1) heating from an ambient temperature (e.g., 23° C.) for a time period which can range from minutes to hours, e.g. 15-30 minutes, in a low pressure (e.g., <2 torr) or high pressure gas mixture including $H_2$+an inert gas mixture (e.g., $H_2$ and $N_2$ both provided at small flow rates, e.g. 100 sccm (standard cubic centimeter per minute)). Heating can be performed at a temperature rise rate of 30° C./min or faster (depending on the growth system parameters); (2) annealing at high temperature (e.g., 950° C.) for 30-60 minutes, or longer, at low pressure (e.g., <1.5 torr) while applying a flow of $H_2$+an inert gas mixture (e.g., $H_2$ and $N_2$ provided at 100 and 50 sccm, respectively); (3) growing the graphene layer 108 for several minutes to tens of minutes at low pressure (e.g., <3 torr) while applying a flow of $H_2$+$CH_4$+an inert gas mixture (e.g., $H_2$, $CH_4$, and $N_2$ provided at 100, 150, and 50 sccm, respectively—these values being examples from an illustrative growth process and system); and (4) cooling at a rate of, e.g., 100° C./min at low pressure (e.g., <2.5 torr) while applying a flow of $H_2$+$CH_4$ (e.g., $H_2$ and $CH_4$ provided at 100 and 150 sccm, respectively) back to an ambient temperature (e.g., 23° C.). The high temperature and low pressure CVD growth of the graphene layer 108 can thereby be used to grow a single-layer or multi-layer graphene layer 108 that extends integrally across the surface of the support member 411.

Figure 5A:
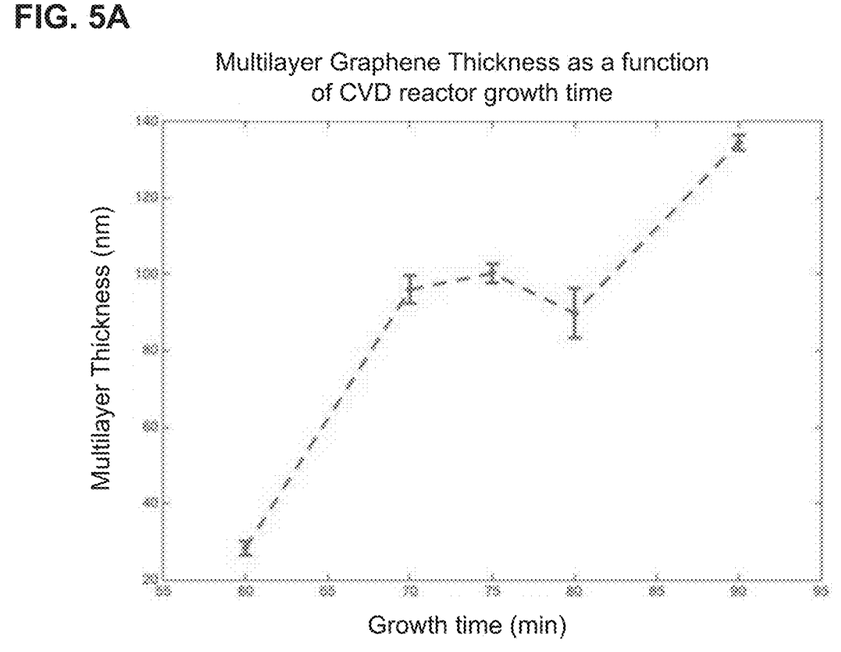
FIG. 5A is a plot showing characteristics of graphene layer growth relative to time.
Figure 5B:
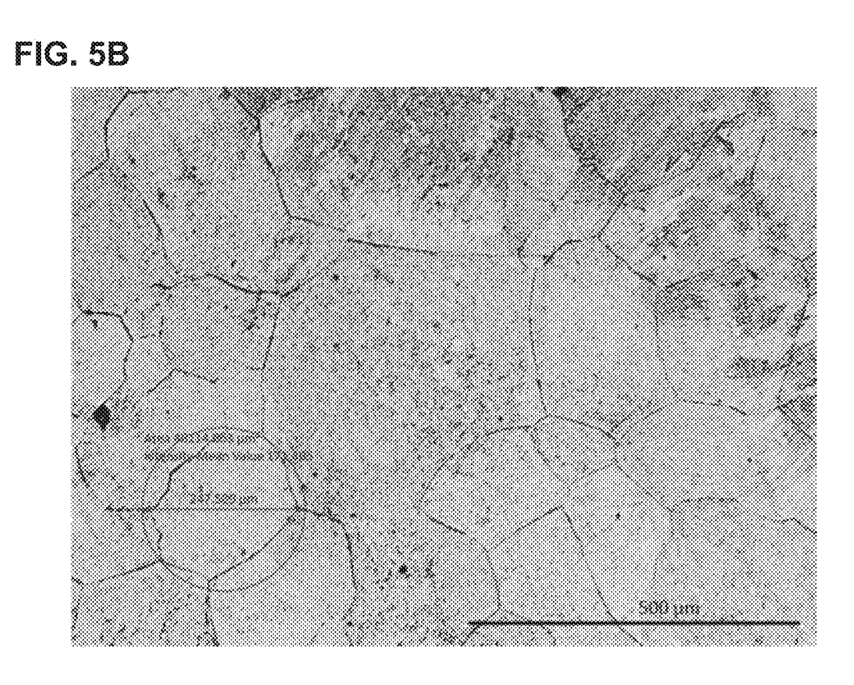
FIGS. 5B and 5C are photographs of graphene layers such as those provided in nanocomposite graphene polymer membranes described in the disclosure.

The thickness of the graphene layer 108 can be adjusted by varying the length of time during which CVD growth is performed. For example, FIG. 5A shows a plot of experimental measurements of a thickness of a multi-layer graphene layer for various growth times. In the experiment, growth onset was observed at 50 minutes after the start of flow of $CH_4$. Additionally, FIG. 5B shows a phase contrast optical image of a multi-layer graphene grown on a nickel (Ni) foil in which single grain size reaches near 0.2 mm$^2$ (this value being the result of one illustrative implementation example that does not limit the exact grain size (or range of grain sizes) of graphene single crystal grains in other embodiments such as those described herein. For instance, the value may decrease or increase based on process parameters, substrate preparation and morphology).

Figure 4B:
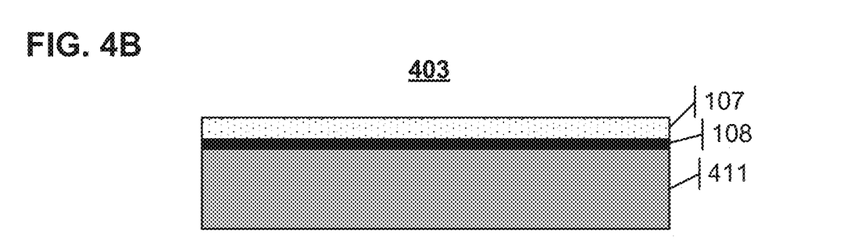

In step 403 shown in FIG. 4B, the polymer layer 107 is formed on the graphene layer 108. The polymer layer 107 may be formed of a layer of thermoplastic polymer or several layers of same or different polymers. In some embodiments, the polymer layer 107 is formed of a polymer having an elevated gas transition temperature (e.g., >950° C.). The polymer layer 107 can be spin coated, spray coated, or solvent cast on the graphene layer 108 and support member 411. Chemical adhesion between the polymer layer 107 and the graphene layer 108 is of a Van der Waals nature by which weak electrostatic bonds are formed across the interface surface. The adhesion provides for the formation of a nanostructured, bi- or multi-layered composite material which has mechanical, electric, and chemical properties which differ substantially from each of its constituents.

Following the forming of the polymer layer 107, the structure is subject to high temperature annealing. The high temperature annealing is performed at a temperature above a glass transition temperature of the polymer forming the polymer layer 107. Once the annealing is complete, processing proceeds to step 405 shown in FIG. 4C.

Note that in order to form the membrane 105a of FIG. 3, the plasmonic nanoparticle layer 110 may be formed on the graphene layer 108 prior to the forming of the polymer layer 107a in step 403. In this regard, the plasmonic nanoparticle layer 110 may be formed by an additional step 402 performed after step 401 and prior to step 403.

Figure 4C:
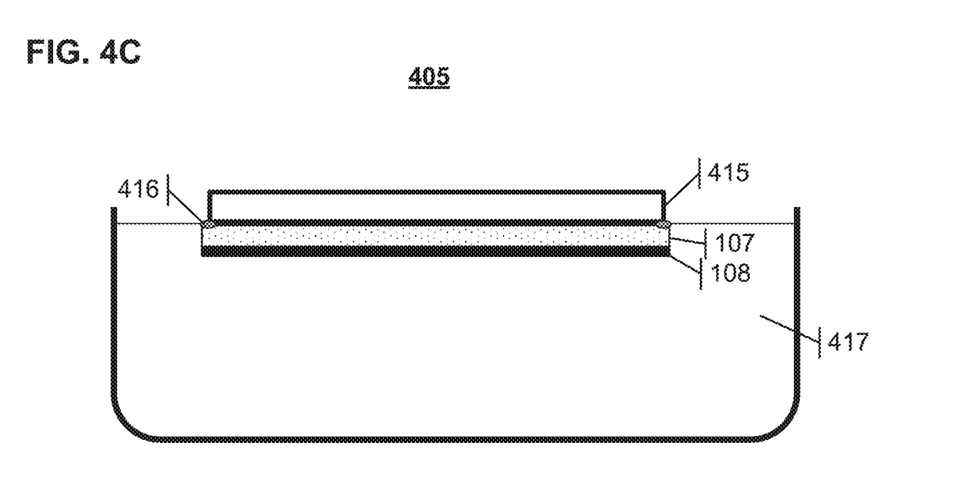

In step 405, the support member 411 is removed from the membrane hetero-structure 105 that includes the graphene layer 108 and the polymer layer 107. The support member 411 can be removed using a metal etch process to remove the metal foil component (or other support member 411 component) and thereby obtain a freely suspended nanocomposite membrane including the graphene layer 108 and the polymer layer 107. The removal of the support member 411 can be performed by placing the structure including the support member 411 and the membrane in an etch salt solution 417, such as a solution including ammonium persulfate, iron chloride, or the like.

Figure 5C:
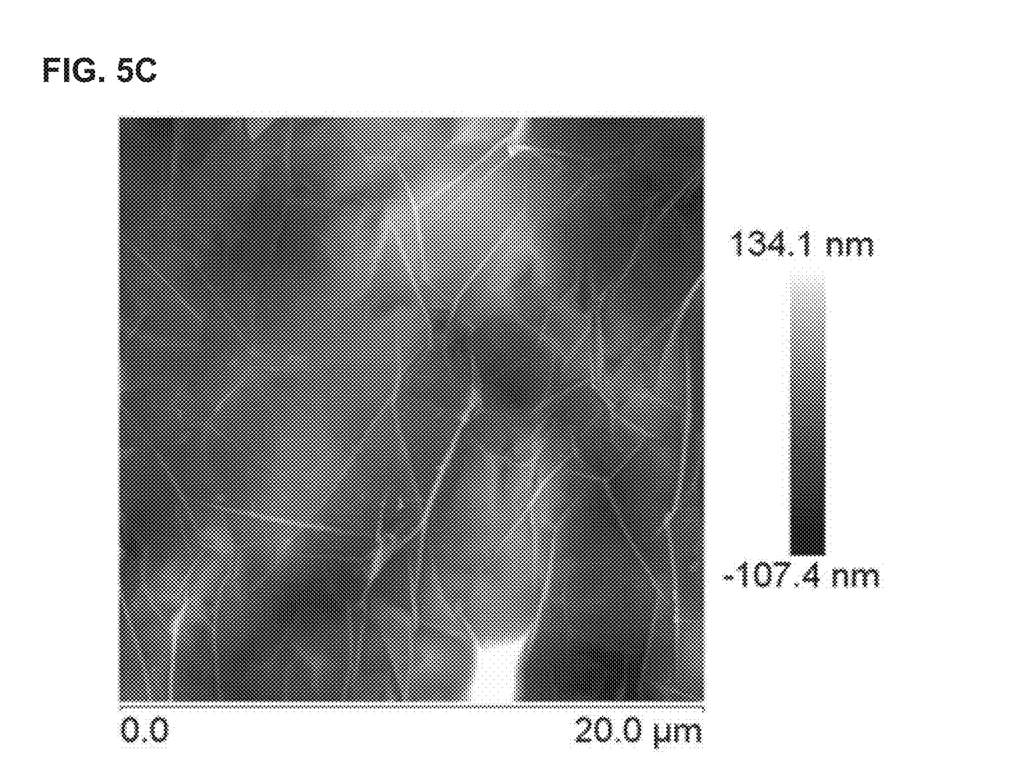

FIG. 5C shows an atomic force microscope (AFM) scan of a multilayer graphene membrane after metal etching of a nickel metal foil therefrom (e.g., step 405) and after transfer of the membrane to a silicon wafer substrate. As shown, the multilayer graphene of FIG. 5C exhibits height variations providing a non-planar membrane structure resulting from roughness in the surface of the nickel metal foil on which the membrane was grown. Using the above procedures, membranes 105 including the graphene layer 108 and the polymer layer 107 were formed with 10 mm diameter and 18 mm diameters, the membranes having multi-layer graphene layers 108 of thickness around 90 nm formed on an ethylene-vinyl acetate (EVA) polymer layer 107 of thickness around 90-100 nm.

In addition, as part of step 405, the membrane 105 (including the graphene layer 108 and the polymer layer 107) is bonded or mounted to a rigid substrate 415 or other support member while a desired in plane mechanical tension is applied to the entire assembly. The membrane 105 may be bonded to the rigid substrate 415 using an adhesive 416. As depicted, the surface of the membrane 105 that is bonded to the rigid substrate 415 may be opposite to the surface of the membrane 105 that was bonded to the support member 411. The rigid substrate 415 can take various forms and, in one example, a petri dish with a diameter equal to or greater than 38 mm is used as the rigid substrate 415. During the bonding, the membrane 105 floats on a surface of an etch bath including the solution 417. During the bonding, the rigid substrate 415 and the adhesive 416 are applied across the surface of the membrane 415 to thereby become bonded to each other.

In one experimental manipulation, a single-layer graphene layer 108 was formed with a polyetherimide PEI (U1010) polymer in a solution of 3 wt % of $CHCl_3$, with the polymer solution spun on the graphene layer 108 formed on a copper foil support member 411. The samples were annealed at 320° C. for 150 seconds. In turn, the PEI/graphene membrane was mounted to a 38 mm petri dish plastic support functioning as the rigid substrate 415 using UV epoxy as the adhesive 416. The sample was floated on a surface of a solution 417 of ammonium persulfate etchant for 1 hour at 85° C. to fully etch away the copper foil. Finally, the sample was rinsed with deionized (DI) water and isopropyl alcohol (IPA). The resulting membrane 105 was formed to a diameter of 38 mm in various experimental manipulations.

In step 405, the removal of the support member 411 from the membrane hetero-structure 105 is described as occurring prior to the bonding of the membrane hetero-structure 105 to the rigid substrate 415. More generally, however, the bonding of the membrane hetero-structure 105 to the rigid substrate 415 can be performed prior to the removal of the support member 411 from the membrane hetero-structure 105.

Figure 4D:
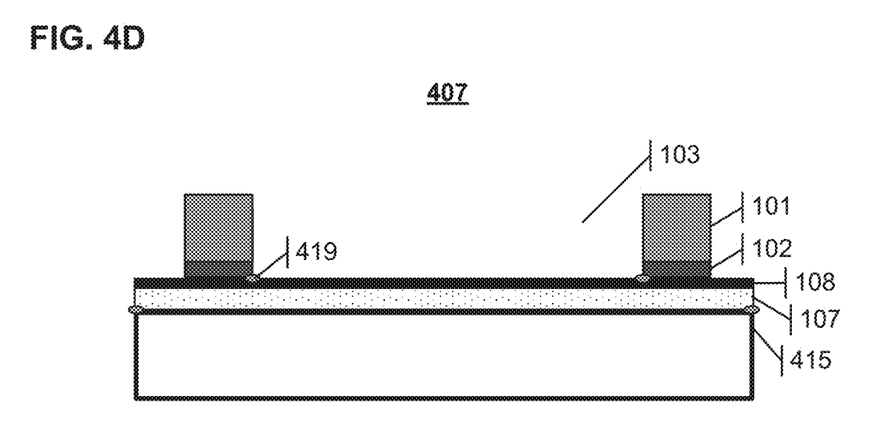

In turn, in step 407 shown in FIG. 4D, the frame 101 having the opening 103 is applied to the membrane 105 adhered to the rigid substrate 415. The frame 101 may be applied to a same surface of the membrane 105 on which the support member 411 was bonded and from which the support member 411 was removed. An adhesive 419, such as a low viscosity adhesive having a long setting time is applied on the frame 101 so as to adhere or bond the frame 101 to the membrane 105. During the bonding, a downward force is applied to the frame 101 so as to push the frame 101 in a direction toward the membrane 105 and substrate 415 to thereby confer a tension across the surface of the membrane 105 as it is bonded by the adhesive 419 to the frame 101. The adhesive 419 is preferably a conductive adhesive that provides electrical conductivity between the contacts 102 and graphene layer 108 that are either in direct contact with each other, or are in direct contact with opposite surfaces of the conductive adhesive 419.

Figure 4E:
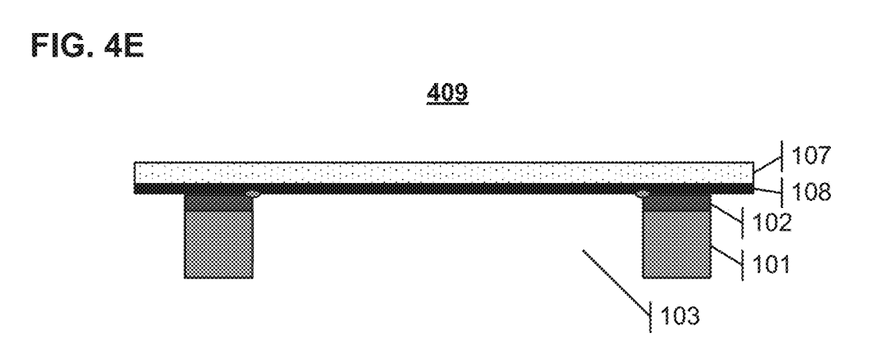

Finally, in step 409 shown in FIG. 4E, the rigid substrate 415 is removed, for example by removing the adhesive 416. Optionally, the assembly of the frame 101 having the membrane 105 mounted thereon and extending across the opening 103 can be annealed. The resulting assembly 100 including the frame 101 and freely suspended membrane 105 is thereby provided. The assembly 100 can be used as an electrostatically actuated micro-electro-mechanical system (MEMS) device capable of producing sound in the audible frequency range at a level comparable to a portable phone speaker while consuming a tenth or less electrical power at the device level. In one embodiment, the assembly 100 may be subject to electrostatic actuation of several hundred volts as part of producing sound at a level comparable to a portable phone speaker.

Figure 4F:
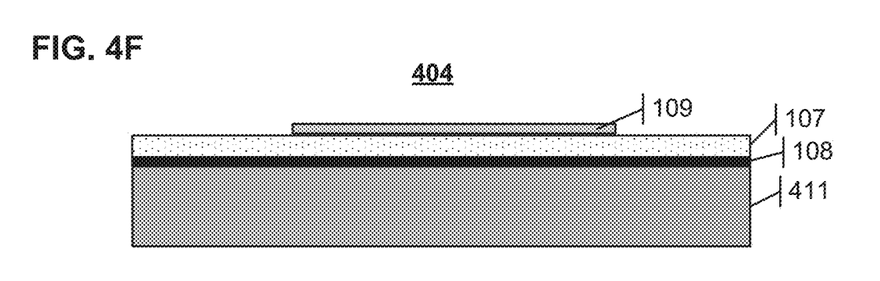

The manufacturing method described in relation to FIGS. 4A-4E can be modified. For example, as shown in FIG. 4F, an additional step 404 can be included following step 403 and prior to step 405 described above. The additional step 404 can include forming a rigid member 109 on the membrane 105 hetero-structure. The rigid member 109 is formed at a location aligned with the eventual position of the opening 103 of the frame 101, such that the rigid member 109 is at a position spaced apart from all edges of the opening 103 in the frame 101. The rigid member 109 can be formed prior to or following the high temperature annealing of the polymer layer 107 on the graphene layer 108.

In accordance with the foregoing, a nanocomposite graphene copolymer membrane with customizable electronic and mechanical properties is provided. The membrane can be attached on one side to a rigid frame to be used in a MEMS (micro-electro-mechanical system) device or similar device such as an electrostatically driven speaker. The membrane includes a hetero-structure of a graphene single or multilayer sheet, a flexible polymer, and an optional rigid ceramic or similar stiff polymer layer suspended from the sheet. The combination of layers provides an electrically conductive diaphragm capable of oscillatory motion around a rest position with excursions (e.g., distance x of FIG. 2) of several hundred micrometers (e.g., +/−150 µm from the rest position) for an overall diameter in the 18-35 mm range. The membrane can thereby maintain a piston like motion for an area exceeding 10-20 mm or 15-20 mm in diameter.

As described, embodiments described herein relate to MEMS and membrane hetero-structures with a very large diameter to thickness radio that can exceed 1,000,000. For example, a membrane can be suspended across an opening with a large diameter (e.g., a diameter of less than or equal to 40 mm) while maintaining a low thickness (e.g., 100-600 nm). The membrane is capable of withstanding large oscillatory motions of several hundred micrometers while operating in a gaseous, liquid, or vacuum environment via electrostatically controlled actuation. This membrane and assembly can thereby provide a highly efficient and small form factor electrostatic speaker using such a membrane as the main sound pressure generating surface.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. An assembly comprising:
   a frame having an opening;
   a membrane hetero-structure contacting the frame and extending across the opening and including a polymer layer extending across the opening and a graphene layer disposed on the polymer layer and extending across the opening; and
   a rigid member disposed on the membrane hetero-structure at a location in the opening of the frame, wherein the rigid member is spaced apart from all edges of the opening in the frame.

2. The assembly of claim 1, wherein the graphene layer comprises a graphene sheet extending fully across the opening of the frame.

3. The assembly of claim 2, wherein the graphene sheet is a single-layer graphene sheet.

4. The assembly of claim 2, wherein the graphene sheet is a multi-layer graphene sheet including a plurality of single-layer graphene sheets each extending fully across the opening of the frame.

5. The assembly of claim 1, wherein the rigid member includes a rigid material including at least one of ceramic, glass, metal, metal oxide, silicon, silica, quartz, and sapphire.

6. The assembly of claim 1, wherein the rigid member includes a polymer layer having a stiffness higher than stiffnesses of each of the membrane hetero-structure, the polymer layer, and the graphene layer.

7. The assembly of claim 1, wherein the opening has a diameter of 12-60 mm, and the rigid member has a diameter smaller than the opening and within the range of 10-20 mm.

8. The assembly of claim 1, wherein the opening has a diameter of 10 to 100 mm, and the membrane hetero-structure extends across a diameter of the opening.

9. The assembly of claim 1, wherein the opening has a diameter of 12 to 60 mm, and the membrane hetero-structure extends across a diameter of the opening.

10. The assembly of claim 1, wherein the membrane hetero-structure has a thickness less than or equal to 600 nm.

11. An assembly comprising:
    a frame having an opening; and
    a membrane hetero-structure contacting the frame and extending across the opening and including a polymer layer extending across the opening and a graphene layer disposed on the polymer layer and extending across the opening, wherein the membrane hetero-structure extends across the opening of the frame with a tension of 0.1-1000 N/m.

12. An assembly comprising:
    a frame having an opening; and
    a membrane hetero-structure contacting the frame and extending across the opening and including a polymer layer extending across the opening and a graphene layer disposed on the polymer layer and extending across the opening, wherein the membrane hetero-structure further includes
       a second polymer layer extending across the opening and disposed such that the graphene layer is between the polymer layer and the second polymer layer, and
       a plasmonic nanoparticle layer disposed between the graphene layer and the second polymer layer.

13. The assembly of claim 12, wherein the membrane hetero-structure further includes a single or multi-layer graphene disposed on the second polymer layer.

14. The assembly of claim 12, wherein the membrane hetero-structure further includes one or more repetitions of the polymer/graphene/polymer/graphene structure.

15. The assembly of claim 1, further comprising:
at least one electric contact terminal mounted to the frame and electrically connected to the graphene layer.

16. A method of forming a micro electro-mechanical system (MEMS), comprising:
applying an adhesive to a frame having an opening; and
tensioning a membrane hetero-structure on the applied adhesive across the opening of the frame, wherein the membrane hetero-structure includes a polymer layer extending across the opening and a graphene layer disposed on the polymer layer and extending across the opening.

17. The method of claim 16, further comprising:
following the tensioning, annealing the assembly of the membrane hetero-structure tensioned across the opening of the frame.

18. The method of claim 16, further comprising:
forming the graphene layer on a metal foil using a chemical vapor deposition (CVD) process; and
forming the polymer layer on the graphene layer using a spin coating, spray coating, or solvent casting process to form the membrane hetero-structure having the metal foil on a first surface thereof,
wherein the membrane hetero-structure is tensioned on the applied adhesive across the opening of the frame following the forming thereof.

19. The method of claim 18, wherein the tensioning the membrane hetero-structure on the applied adhesive across the opening of the frame further comprises:
mounting a support member to a second surface of the membrane hetero-structure including the polymer layer and the graphene layer, wherein the second surface is disposed opposite to the first surface having the metal foil;
removing the metal foil from the first surface of the membrane hetero-structure using an etching process;
applying the frame having the adhesive applied thereto to the first surface of the membrane hetero-structure following the removal of the metal foil; and
removing the support member from the second surface of the membrane hetero-structure following the application of the frame.

20. The method of claim 16, further comprising:
forming a rigid member on the membrane hetero-structure at a location in the opening of the frame, wherein the rigid member is spaced apart from all edges of the opening in the frame.

* * * * *